United States Patent
Penunuri et al.

(10) Patent No.: US 10,553,570 B2
(45) Date of Patent: Feb. 4, 2020

(54) NETWORK WITH INTEGRATED PASSIVE DEVICE AND CONDUCTIVE TRACE IN PACKAGING SUBSTRATE AND RELATED MODULES AND DEVICES

(71) Applicant: Skyworks Solutions, Inc., Woburn, MA (US)

(72) Inventors: David Penunuri, Simi Valley, CA (US); Weimin Sun, Santa Rosa Valley, CA (US); Russ Alan Reisner, Oxnard, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/960,199

(22) Filed: Apr. 23, 2018

(65) Prior Publication Data

US 2018/0358338 A1    Dec. 13, 2018

Related U.S. Application Data

(63) Continuation of application No. 14/864,643, filed on Sep. 24, 2015, now Pat. No. 9,978,732.

(Continued)

(51) Int. Cl.
*H01L 25/16* (2006.01)
*H01L 23/66* (2006.01)

(52) U.S. Cl.
CPC .............. *H01L 25/16* (2013.01); *H01L 23/66* (2013.01); *H01L 2924/0002* (2013.01)

(58) Field of Classification Search
CPC ....... H01L 2924/00; H01L 2924/00014; H01L 2224/32225; H01L 2224/48091; H01L 2924/0002; H01L 2224/48227; H01L 2224/73265; H01L 23/66; H01L 2924/00012; H01L 2224/16225; H01L 2224/45015; H01L 2224/45099; H01L 2924/14; H01L 2224/73204; H01L 2924/30107; H01L 2223/6655; H01L 28/10; H03F 2200/387; H03F 1/565; H03F 3/193; H03F 3/195; H03F 3/245;
(Continued)

(56) References Cited

U.S. PATENT DOCUMENTS 5,726,603 A    3/1998  Chawla et al.
7,418,251 B2   8/2008  Liu
(Continued)

FOREIGN PATENT DOCUMENTS

CN    1512628      7/2004
CN    102055414    5/2011
CN    102769434    11/2012

*Primary Examiner* — Golam Sorowar
(74) *Attorney, Agent, or Firm* — Knobbe, Martens, Olson & Bear, LLP

(57) ABSTRACT

In an embodiment, an apparatus includes a packaging substrate and a die on the packaging substrate. The die includes an integrated passive device and a contact providing an electrical connection to the integrated passive device. A conductive trace of the packaging substrate is in an electrical path between the contact of the die and a ground potential. Such an integrated passive device and conductive trace can be included in a matching network configured to receive an amplified radio frequency signal from a power amplifier, for example. The packaging substrate can be, for example, a laminate substrate.

20 Claims, 9 Drawing Sheets

Related U.S. Application Data

(60) Provisional application No. 62/057,821, filed on Sep. 30, 2014.

(58) Field of Classification Search
CPC ......... H03F 2200/222; H03F 2200/451; H03F 3/191; H03F 3/24; H03F 1/00; H03F 1/0227; H03F 1/0277; H03F 1/56; H03F 2200/111; H03F 2200/171; H03F 2200/204; H03F 2200/318; H03F 2200/391; H03F 2200/411; H03H 2001/0064; H03H 7/09; H03H 7/1775; H03H 7/38; H03H 7/42; H03H 2001/0078; H03H 7/1758; H03H 7/1766; H03H 7/1783; H03H 2007/386; H03H 7/0115; H03H 7/0153; H03H 7/1733; H03H 7/175; H03H 7/422; H03H 7/463; H03H 9/54
See application file for complete search history.

(56) References Cited

U.S. PATENT DOCUMENTS

| | | | |
|---|---|---|---|
| 7,990,220 B2 | 8/2011 | Kondo et al. | |
| 8,148,793 B2 | 4/2012 | Liu | |
| 8,299,572 B2 | 10/2012 | Reisner | |
| 8,349,648 B2 * | 1/2013 | Kim | H01L 21/56 438/107 |
| 8,786,079 B2 | 7/2014 | Lee et al. | |
| 9,264,011 B2 | 2/2016 | Ishuzuka et al. | |
| 9,306,502 B2 | 4/2016 | Chan | |
| 9,978,732 B2 | 5/2018 | Penunuri et al. | |
| 2003/0134453 A1 | 7/2003 | Prabhu et al. | |
| 2004/0106311 A1 | 6/2004 | Rothermel et al. | |
| 2008/0278258 A1 * | 11/2008 | Liu | H03H 7/42 333/25 |
| 2009/0115562 A1 * | 5/2009 | Lee | H01F 17/0006 336/200 |
| 2011/0057851 A1 | 3/2011 | Chung | |
| 2011/0133853 A1 * | 6/2011 | Harima | H01L 23/66 333/175 |
| 2011/0193243 A1 * | 8/2011 | Gupta | H01L 21/563 257/778 |
| 2011/0193653 A1 | 8/2011 | Ou | |
| 2011/0299256 A1 | 12/2011 | Leiba | |
| 2012/0280755 A1 | 11/2012 | Wright | |
| 2012/0319302 A1 | 12/2012 | Lee et al. | |
| 2013/0029620 A1 | 1/2013 | Liu | |
| 2013/0154735 A1 * | 6/2013 | Hase | H03F 3/191 330/192 |
| 2013/0194139 A1 | 8/2013 | Nickel | |
| 2013/0214423 A1 | 8/2013 | Sadaka | |
| 2013/0222060 A1 | 8/2013 | Lo | |
| 2014/0084414 A1 | 3/2014 | Jezewski | |
| 2014/0159835 A1 | 5/2014 | Lo Hine Tong | |
| 2014/0320252 A1 | 10/2014 | Sun et al. | |
| 2014/0361628 A1 | 12/2014 | Huang | |

\* cited by examiner

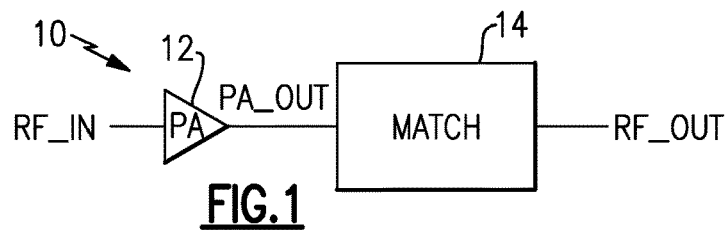
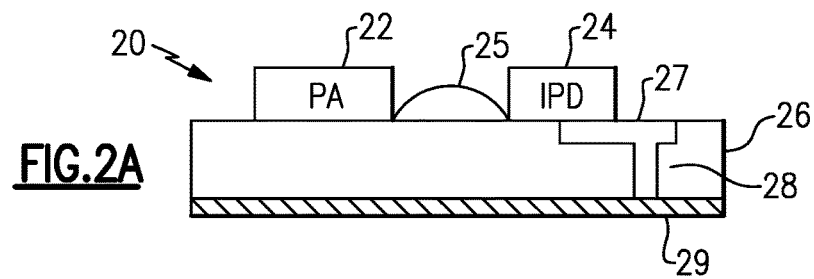
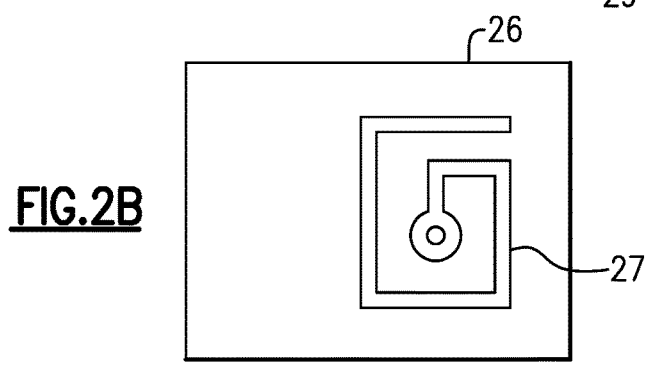
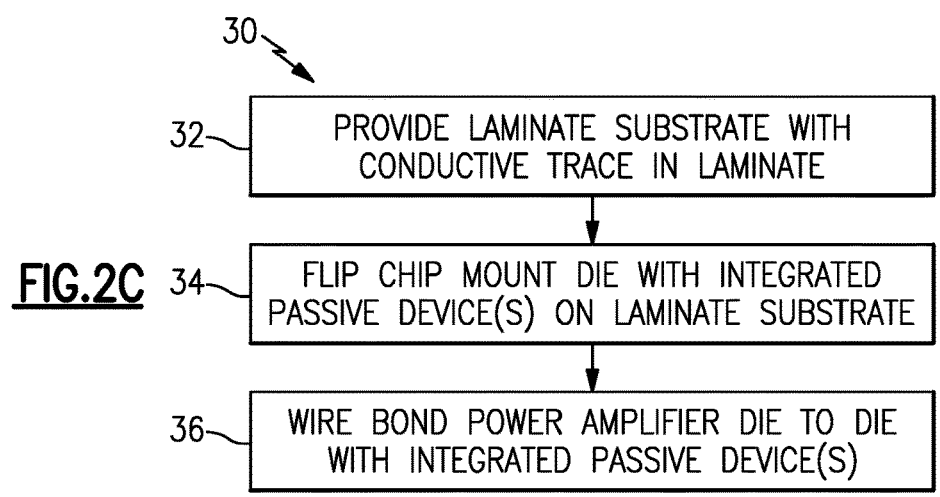
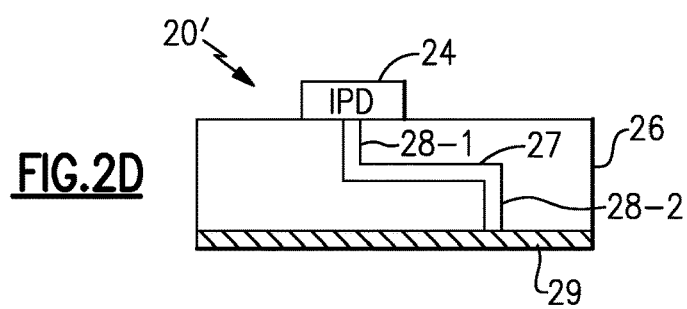

NETWORK WITH INTEGRATED PASSIVE DEVICE AND CONDUCTIVE TRACE IN PACKAGING SUBSTRATE AND RELATED MODULES AND DEVICES

CROSS-REFERENCE TO RELATED APPLICATIONS

This application is a continuation of U.S. patent application Ser. No. 14/864,643, filed Sep. 24, 2015 and titled "NETWORK WITH INTEGRATED PASSIVE DEVICE AND CONDUCTIVE TRACE IN PACKAGING SUBSTRATE AND RELATED MODULES AND DEVICES," which claims the benefit of priority under 35 U.S.C. § 119(e) of U.S. Provisional Patent Application No. 62/057,821, filed Sep. 30, 2014 and titled "MATCHING NETWORK WITH INTEGRATED PASSIVE DEVICE AND CONDUCTIVE TRACE IN LAMINATE," the disclosures of each of which are hereby incorporated by reference in their entireties herein.

BACKGROUND

Technical Field

This disclosure relates to electronic systems and, in particular, to electronic systems that include passive impedance elements.

Description of the Related Technology

The physical size of components for mobile phones and other mobile devices is being decreased. Circuit design and methods of physical implementation can facilitate the reduction in size of such components.

Power amplifier modules are included as components in many mobile devices. Power amplifier modules typically include one or more power amplifiers and one or more associated matching networks. A matching network can provide impedance matching and one or more other functions, such as harmonic frequency suppression, filtering, impedance rotation, or the like. A matching network can include passive impedance elements implemented on a power amplifier die, as a surface mounted component(s) on a packaging substrate, on a die that includes an integrated passive device, or any combination thereof. The passive impedance elements can include transformer(s), coil(s), capacitor(s), inductor(s), the like, or any combination thereof.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an apparatus that includes a packaging substrate, a die on the packaging substrate, and a conductive trace of the packaging substrate. The die includes an integrated passive device and a contact providing an electrical connection to the integrated passive device. The conductive trace is in an electrical path between the contact of the die and a ground potential.

The conductive trace can be included in a matching network configured to provide impedance matching and to suppress a harmonic frequency of a radio frequency signal received by the matching network. A length of the conductive trace together with a capacitance of the integrated passive device can suppress the harmonic frequency of the radio frequency signal.

The conductive trace can have a length that is greater than a largest dimension of the die. The conductive trace can have a length of at least 50 microns. The conductive trace can have a length of at least 100 microns. The conductive trace can be substantially spiral shaped in plan view. The conductive trace can include copper.

The apparatus can also include a power amplifier die on the packaging substrate. The power amplifier die can include a power amplifier configured to provide the radio frequency signal to a matching network that includes the integrated passive device and the conductive trace.

The packaging substrate can be a laminate substrate. The die can be a silicon die. For instance, the die can be a silicon die and the integrated passive device can be formed with a thin film process. The contact of the die can be a bump pad and the die can be flip chip mounted on the packaging substrate. At least a portion of the conductive trace can be disposed below a footprint of the die.

The integrated passive device can be a capacitor. The apparatus can further include a second conductive trace of the packaging substrate, the integrated passive device can include a first integrated capacitor, and the die can further include a second integrated capacitor arranged in series with the second conductive trace.

Another aspect of this disclosure is an apparatus that includes a first die on a laminate substrate, a second die on the laminate substrate, and a conductive trace of the laminate substrate. The first die includes a power amplifier configured to receive a radio frequency (RF) input signal and provide an amplified RF signal. The second die is configured to receive the amplified RF signal. The second die includes an integrated passive device. The conductive trace is in an electrical path between the integrated passive device and a ground potential.

The conductive trace can be substantially spiral shaped in plan view. A length of the conductive trace together with a capacitance of the integrated passive device can suppress a harmonic frequency of the amplified RF signal. The integrated passive device and the conductive trace can be included in a matching network configured to provide impedance transformation and an L-C filter, such as an elliptic filter, in which the matching network configured to receive the amplified RF signal. The integrated passive device and the conductive trace can be included in a matching network configured to provide impedance matching and phase rotation, in which the matching network configured to receive the amplified RF signal.

Another aspect of this disclosure is a mobile device that includes a multi-chip module, an antenna, and a battery. The multi-chip module includes a power amplifier die on a laminate substrate, an integrated passive device (IPD) die on the laminate substrate, and a conductive trace of the laminate substrate. The power amplifier die includes a power amplifier configured to receive a radio frequency (RF) input signal and provide an amplified RF signal. The IPD die includes an integrated capacitor and is configured to receive the amplified RF signal. The conductive trace is in series between the integrated capacitor and a ground potential. The antenna is configured to receive a processed version of the amplified RF signal from the IPD die. The battery is configured to provide a supply voltage to the multi-chip module.

The mobile device can be a cellular phone in which the multi-chip module is a multi-band module.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 1 is a schematic diagram of a power amplifier system including a power amplifier and a matching network.

FIG. 2A is a schematic diagram of a multi-chip module that includes the power amplifier and the matching network of FIG. 1, according to an embodiment.

FIG. 2B is a plan view of a conductive trace in the packaging substrate of the multi-chip module of FIG. 2A, according to an embodiment.

FIG. 2C is a flow diagram of method for manufacturing a multi-chip module, according to an embodiment.

FIG. 2D is a schematic diagram of a module that includes the matching network of FIG. 1, according to an embodiment.

DETAILED DESCRIPTION OF CERTAIN EMBODIMENTS

Figure 3:
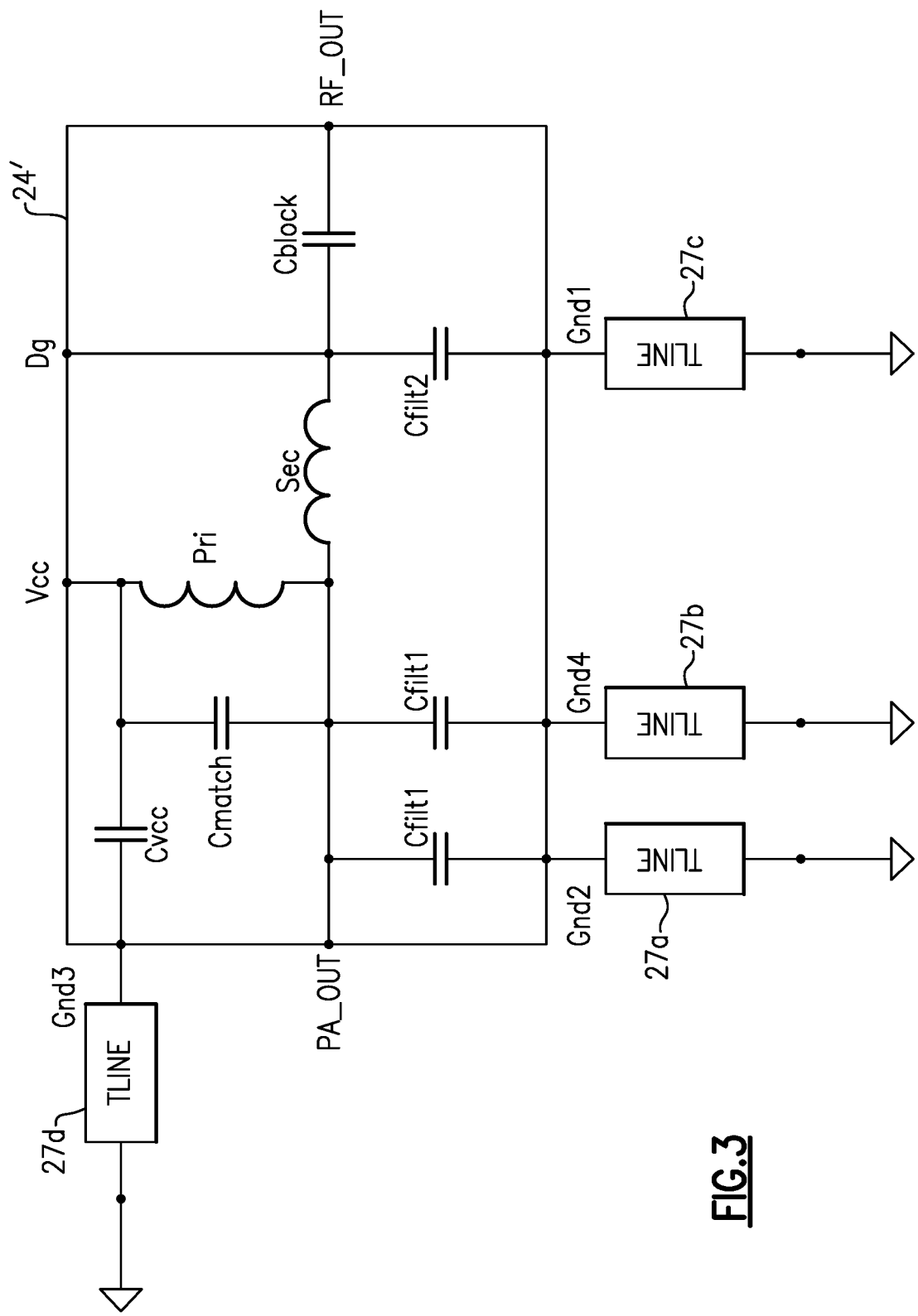
FIG. 3 is a schematic diagram of an integrated passive device (IPD) die and traces in a packaging substrate configured to provide impedance matching and harmonic rejection, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Multi-band front end modules for mobile phone applications are becoming more and more miniaturized. Accordingly, it can be advantageous to perform multiple electrical functions with a single circuit. For example, an impedance matching circuit or filter may include one or more transformers, one or more capacitors, one or more inductors, the like, or any combination thereof. These circuit elements are often realized using multilayer structures. Examples of such circuit elements are fabricated in or on organic laminates with electrolytically deposited copper vias and traces. Further examples of these circuit elements include integrated passive devices (IPDs), which can be fabricated on a silicon die using thin film processes.

Combined electrical functions, such as impedance matching and harmonic frequency suppression, can be implemented by a matching network. For example, in a power amplifier module, it may be desirable for a relatively low impedance of the power amplifier die to be matched to a standard impedance, such as 50 Ohms, within the operating band of frequencies and to simultaneously suppress one or more harmonics which can accompany an output of the power amplifier. Such an impedance matching circuit can include capacitors connected in a shunt manner to radio frequency (RF) ground. An appropriately valued inductor may be included between one terminal of the capacitor and RF ground. This series connected circuit can be configured to resonate at a frequency determined by the inductance value of the inductor and capacitance value of the capacitor and to create a short circuit, thereby suppressing the transmission of a signal at this frequency. Such a frequency can be referred to as a trap frequency, and is typically one of the harmonics of the fundamental frequency response.

One or more capacitance values in a matching network can be set by characteristics of the matching circuit, typically the impedance transformation ratio. Therefore, the trap frequency can typically be adjusted by choosing the inductance value instead of adjusting the capacitance in the LC shunt circuit. At relatively low frequency bands (such as a frequency band centered at about 700 MHz, a frequency band centered at about 800 MHz, a frequency band centered at about 900 MHz, Long Term Evolution Band 13, Long Term Evolution Band 5, etc.) this inductance value can become sufficiently large that it becomes difficult for the inductor to be efficiently realized using traditional integration methods. This problem can make it difficult to realize miniaturized front end modules, particularly when a communication within multiple frequency bands is supported.

Some previous integration approaches involving LC circuits in an all-organic laminate have encountered geometrical limitations imposed by the laminate fabrication process, which can restrict a maximum impedance ratio. Surface mount technology components can consume a relatively large surface area, which can make miniaturization difficult. Moreover, implementing harmonic frequency traps on a power amplifier die can result in inductors having a relatively low Q such that an in-band loss penalty may occur (e.g., particularly for a second harmonic trap) and/or the maximum harmonic suppression can be inadequate. Previous integrated passive device (IPD) approaches have provided little or no harmonic frequency suppression.

An impedance matching transformer fabricated on an IPD die can be arranged to connect an RF output of a power amplifier (PA) die, which can have a relatively low impedance (e.g., about 2 Ohms to 5 Ohms) for optimum performance, to a relatively higher impedance (e.g., 50 Ohms). In certain instances, the IPD die is flip chip bonded to the underlying laminate. While such a circuit can achieve a desired in-band performance, the out-of-band rejection can generally be poor with little or no trap rejection indicated at the second and third harmonics.

Generally described, aspects of this disclosure relate to an integrated passive device on an IPD die that is electrically connected to a conductive trace of a packaging substrate on which the IPD die is positioned. For instance, the IPD die can be flip chip mounted on a laminate packaging substrate. The conductive trace can be included in an electrical path between a contact, such as a bump pad, of the integrated passive device and a ground potential, such as a ground plane. The electrical path can also include one or more vias disposed between the conductive trace and the ground potential. The integrated passive device can be an IPD capacitor that is electrically connected to the conductive trace. A length of the conductive trace can implement an inductive impedance. The impedance of the IPD capacitor together with the impedance of the conductive trace can implement various functions in a matching network, such as harmonic frequency rejection, filtering, impedance rotation, the like, or any combination thereof. The matching network can be electrically connected to an output of a power amplifier.

In an embodiment, one or more IPD capacitors are connected to ground by way of transmission line traces with non-zero lengths implemented in a laminate. The impedance and length of each trace can be selected so as to resonate a respective IPD capacitor at a desired harmonic frequency. The resulting resonance can provide a transmission zero that traps the harmonic response and shunts it to ground. Two or more shunt IPD capacitors can be fabricated on the same IPD die, and each of these IPD capacitors can be resonated at a distinct frequency. As one example, one IPD capacitor on the IPD die can be resonated at a second harmonic frequency and another IPD capacitor on the same IPD die can be resonated at a third harmonic frequency. As another example, one IPD capacitor on the IPD die can be resonated at a third harmonic frequency and another IPD capacitor on the same IPD die can be resonated at a fourth harmonic frequency. More generally, different IPD capacitors on an IPD die can be resonated at different desired frequencies by including an appropriately configured trace in the laminate on which the IPD die is disposed.

In another embodiment, several IPD capacitors can be similarly resonated with laminate traces at a frequency in a rejection band (e.g., a frequency above the normal pass band). These IPD capacitors can be coupled appropriately using the residual inductance of the IPD transformer secondary coil and, in some instances, the coil turn-to-turn stray capacitance to create, for example, an elliptic filter. Since an elliptic filter exhibits equalized ripple (equi-ripple) responses in both the pass band and the stop band, this type of filter can thus provide rejection relatively near and about the resonant frequency to create a stop band which can suppress undesired signals that may occur. An elliptic is therefore a good option for providing harmonic frequency traps while also providing relatively low insertion loss in the pass band.

In another embodiment, an IPD and a trace in a laminate can together provide impedance rotation. A transmit port impedance of a surface acoustic wave (SAW) duplexer or a bulk acoustic wave (BAW) duplexer can be such that the magnitude of the resistive part at the band edges is at a maximum. When this impedance is matched to the power amplifier collector that is electrically coupled to a matching network that includes the IPD, the efficiency is therefore reduced at the band edges relative to the band center. With a design that includes relatively long traces in the supporting laminate, a SAW duplexer impedance and/or a BAW duplexer impedance can be rotated in the Smith chart. Thus, the matched impedance presented to the power amplifier collector can be rotated such that the magnitude of the resistive part at the band edges is at or near a minimum. The power efficiency can therefore be improved at the band edges relative to the band center by such impedance rotation.

Particular implementations of the subject matter described in this disclosure can be implemented to realize one or more of the following potential advantages, among others. An IPD and trace in a packaging substrate (e.g., a laminate substrate) on which the die that includes the IPD is disposed can reject one or more harmonics and/or other spurious signals occurring at the power amplifier RF output. One or more selectivity functions can be combined with an impedance matching function in the same IPD die by implementing one or more conductive traces in physical area which is generally available but typically unused in the laminate under a flip chip mounted IPD die. This can provide a more compact component. The impedance of external components can be conditioned prior to application to the power amplifier collector, for example, by way of phase rotation.

Referring to FIG. 1 a schematic diagram of power amplifier system that includes a power amplifier and a matching network will be described. As illustrated, a power amplifier system 10 includes a power amplifier 12 and a matching network 14. The power amplifier 12 is configured to amplify an RF signal RF_IN and provide an amplified RF signal PA_OUT. An RF signal can have a frequency in the range from about 30 kHz to 300 GHz, such as in a range from about 450 MHz to about 4 GHz for radio frequency signals in Long Term Evolution systems. The power amplifier 12 can be any suitable RF power amplifier. For instance, the power amplifier 12 can be one or more of a single stage power amplifier, a multi-stage power amplifier, a power amplifier implemented by one or more bipolar transistors, or a power amplifier implemented by one or more field effect transistors.

The matching network 14 can aid in reducing signal reflections and/or other signal distortions. The matching network 14 can include one or more capacitors and one or more inductors. The matching network 14 can include one or more of a shunt capacitor, a shunt inductor, a shunt series LC circuit, or a parallel LC circuit in a signal path between the power amplifier 12 and an output RF_OUT of the matching network 14. The matching network 14 can include an IPD capacitor on an IPD die and a conductive trace in a laminate on which the IPD die is positioned. In certain implementations, a portion of the matching network 14 can be implemented on a power amplifier die that includes the power amplifier 10. The output RF_OUT of the matching network 14 can be provided to an antenna by way on a switch module, for example. For instance, the output RF_OUT can be provided to a duplexer, such as a SAW duplexer or a BAW duplexer, in the switch module and a processed version of the output RF_OUT can be provided to the antenna.

FIG. 2A is a schematic diagram of a multi-chip module 20 according to an embodiment. The multi-chip module 20 can include a power amplifier die and an IPD die encapsulated together within a package. The multi-chip module can be referred to as a power amplifier module when the multi-chip module includes a power amplifier die. The illustrated multi-chip module 20 includes a power amplifier die 22, and IPD die 24, a wire bond 25, a laminate substrate 26, a conductive trace 27, a via 28, and a ground plane 29. While FIG. 2A and other embodiments may be discussed in connection with a laminate substrate for illustrative purposes, a conductive trace can be implemented in other suitable packaging substrates in accordance with the principles and advantages discussed herein. As one example, the conductive trace can be implemented in a ceramic packaging substrate in some implementations.

As illustrated, the power amplifier die 22 is in electrical communication with the IPD die 24 by way of the wire bond 25. The wire bond 25 can provide an inductance between the power amplifier die 22 and the IPD die 24. More than one wire bond 25 can electrically connect the power amplifier die 22 and the IPD die 24. Such wire bonds can be arranged in parallel with each other. Other suitable electrical connections can electrically connect an output of a power amplifier of the power amplifier die 22 to the IPD die 24. The power amplifier die 22 can include any of the power amplifiers discussed herein. In certain implementations, the power amplifier die 22 can include at least a portion of one or more termination circuits, such as LC shunt circuits, for harmonic frequencies, such as the second harmonic frequency and/or the fourth harmonic frequency. The power amplifier die 22 can be a GaAs die, CMOS die, or a SiGe die in certain implementations.

The IPD die 24 can include any of the IPDs discussed herein. As used herein, "IPD die" can refer to any suitable die that includes one or more IPDs. The IPD die 24 can be a silicon die or a die of any other suitable insulating material. In some such implementations, one or more IPDs can be formed using a thin film process. The IPD die 24 can be flip chip mounted on a laminate substrate 26 as shown in FIG. 2A. In other embodiments, the IPD die 24 can be otherwise coupled to the laminate substrate 26. A conductive trace 27 in the laminate substrate 26 can provide an inductive impedance. When the IPD die 24 is flip chip mounted on the laminate substrate 26, a bump (e.g., a solder bump or a copper pillar) can electrically connect the IPD die 24 to the conductive trace 27. The IPD die 24 can include a bump pad to provide an electrical connection for an IPD and the bump pad can be in physical and electrical contact with the bump.

In certain implementations, a power amplifier of the power amplifier die 22 can generate a radio frequency signal having a frequency in a range from about 500 MHz to about 1 GHz, such as in a range from about 700 MHz to about 900 MHz. In such implementations, an inductance of an LC shunt circuit in the matching network can be sufficiently large that it becomes difficult for the inductor of the LC shunt circuit to be efficiently realized. Accordingly, implementing an inductive component is such implementations as a conductive trace 27 in a laminate substrate 26 can be advantageous.

The conductive trace 27 can be implemented by copper, for example. The conductive trace 27 can extend in a direction substantially parallel to the IPD die 24. The conductive trace 27 can have a length that is greater than a longest dimension of the IPD die 24. In certain applications, the conductive trace 27 can have a length of at least 50 microns. According to some of these applications, the conductive trace 27 can have a length of at least 100 microns. The length of the conductive trace 27 need not be straight and can account for turns and/or bends in the conductive trace 27. The conductive trace 27 can be spiral shape in plan view in certain applications. The conductive trace 27 can be electrically connected to RF ground 29 by way of a via 28 in the laminate substrate 26. Accordingly, the conductive trace 27 may be referred to as a ground trace.

FIG. 2B is a plan view of an example conductive trace 27 in the laminate substrate 26 of the multi-chip module 20 of FIG. 2A. As shown in FIG. 2B, the conductive trace 27 is substantially spiral shaped in plan view. At least a portion of the conductive trace 27 can be disposed below a footprint of the IPD die 24. For instance, a majority of the conductive trace 27 can be disposed below the footprint of the IPD die 24. While one conductive trace 27 is shown for illustrative purposes, it will be understood that two or more such conductive traces can be included in some other embodiments. As one example, the embodiment shown in FIG. 3 includes 4 conductive traces 27a to 27d in the laminate substrate 26. As another example, conductive traces in different layers of the laminate substrate 26 can be at least partially stacked over each other. Moreover, other conductive traces (not illustrated) can be included in the laminate substrate 26 for purposes other than providing a ground connection to an IPD on an IPD die 24.

FIG. 2C is a flow diagram of method 30 of manufacturing a multi-chip module, according to an embodiment. The multi-chip module 20 can be manufactured in accordance with the method 30. At block 32, a laminate substrate with a conductive trace in laminate can be provided. In some instances, the method 30 can include forming such a laminate substrate. A die that includes one or more integrated passive devices can be flip chip mounted on the laminate substrate at block 34. Accordingly, devices of the die can be on a side that faces the laminate substrate. One or more bumps can electrically connect an integrated passive device of the die to the conductive trace in the laminate. An output of a power amplifier die on the laminate substrate can be wire bonded to an input of the die that includes the integrated passive device at block 36. This can provide an electrical path to provide an RF signal between a power amplifier and a matching network. Some or all of the operations discussed with reference to FIG. 2C can be performed in certain embodiments. The acts of any methods discussed herein can be performed in any order as appropriate. Moreover, the acts of any of the methods discussed herein can be performed serially or in parallel, as appropriate. Furthermore, any of the methods discussed herein can be performed in connection with manufacturing any of the devices discussed herein.

FIG. 2D is a schematic diagram of a module 20' according to an embodiment. The module 20' is similar to the multi-chip module 20 of FIG. 2A. Any combination of features of the embodiment of FIG. 2D can be implemented in connection with the embodiment of FIG. 2A or any of the other embodiments discussed herein. While FIG. 2D is focused on illustrating the IPD die 24 and an associated electrical connection to RF ground, the module 20' can also include a power amplifier die and/or one or more other dies. FIG. 2D shows that the conductive trace 27 can be electrically connected to the IPD die 24 by way of a first via 28-1 embedded in the laminate substrate 26. In FIG. 2D, a shunt capacitor on the IPD die 24 can be electrically connected to RF ground by way of a bump, the first via 28-1, the trace 27 embedded in the substrate 26, and a second via 28-2. In some other embodiments, two or more vias in the same layer of a substrate and/or two or more vias in different layers of the substrate can be included in an electrical path between the trace 27 and RF ground. Alternatively or additionally, two or more vias in the same layer of a substrate and/or two or more vias in different layers of the substrate can be included in an electrical path between the trace 27 and the IPD die 24.

FIG. 3 is a schematic diagram of an IPD die and traces in laminate configured to provide impedance matching and harmonic rejection, according to an embodiment. The IPD die 24' of FIG. 3 is one example of an IPD die 24 of FIG. 2A. In FIG. 3, the IPD die 24' includes IPD capacitors Cvcc, Cmatch, C2foB, Cfilt1, Cfilt2, and Cblock and IPD inductors Pri and Sec. The IPD capacitors and/or IPD inductors can be formed on a silicon die or a die of any other suitable insulating material using a thin film process, for example. The IPD capacitors and IPD inductors of the IPD die 24' can be included in the matching network 14 of FIG. 1. As illustrated, the IPD die 24' can receive a power amplifier output signal PA_OUT and provide an RF output RF_OUT.

Instead of a bump connecting IPD capacitors directly to vias in a laminate substrate, the IPD shunt capacitors C2foB, Cfilt1, Cfilt2, and $C_{VCC}$ of the IPD die 24' are connected to ground by way of conductive traces 27a to 27d, respectively, in the laminate substrate. The conductive traces 27a to 27d are in turn connected to vias in the laminate substrate in the embodiment of FIG. 3. In FIG. 3, the IPD shunt capacitors are connected to conductive traces, such as copper traces, in the laminate substrate by way of respective bumps. Accordingly, each of the IPD shunt capacitors is electrically connected to RF ground by way of a bump, a conductive trace, and a via. In certain implementations, one or more of the IPD shunt capacitors can be electrically connected to RF ground by way of a bump, a via, an embedded trace, and another via, for example, as illustrated in FIG. 2D. RF ground can be implemented by a ground plane for a module that includes a power amplifier die and an IPD die. In the embodiment of FIG. 3, the electrical connections between shunt capacitors and conductive traces can be implemented by bumps and the contacts of the die to Gnd1, Gnd2, Gnd3, and Gnd4 can be implemented by bump pads.

The conductive traces 27a to 27d serve as inductances between respective IPD capacitors and RF ground. The conductive traces 27a to 27d can each have a length selected to resonate a respective IPD shunt capacitor electrically connected thereto. The length of a conductive trace 27a to 27e can be selected such that the impedance of the conductive trace together with the impedance of an IPD shunt capacitor electrically connected thereto provides a frequency trap at a particular frequency, such as a harmonic frequency. Accordingly, the length of a conductive trace can be selected to provide rejection at a particular harmonic frequency. As one example, the capacitance of the capacitor C2foB and the impedance of the conductive trace 27a can be selected so as to together provide harmonic rejection at a second harmonic frequency of an output of a power amplifier. The capacitance of the capacitor C2foB can be selected based on characteristics of the matching circuit, such as the impedance transformation ratio, and the length of the conductive trace 27a can be selected to provide harmonic rejection at the second harmonic based on the capacitance of the capacitor C2foB.

Figure 4:
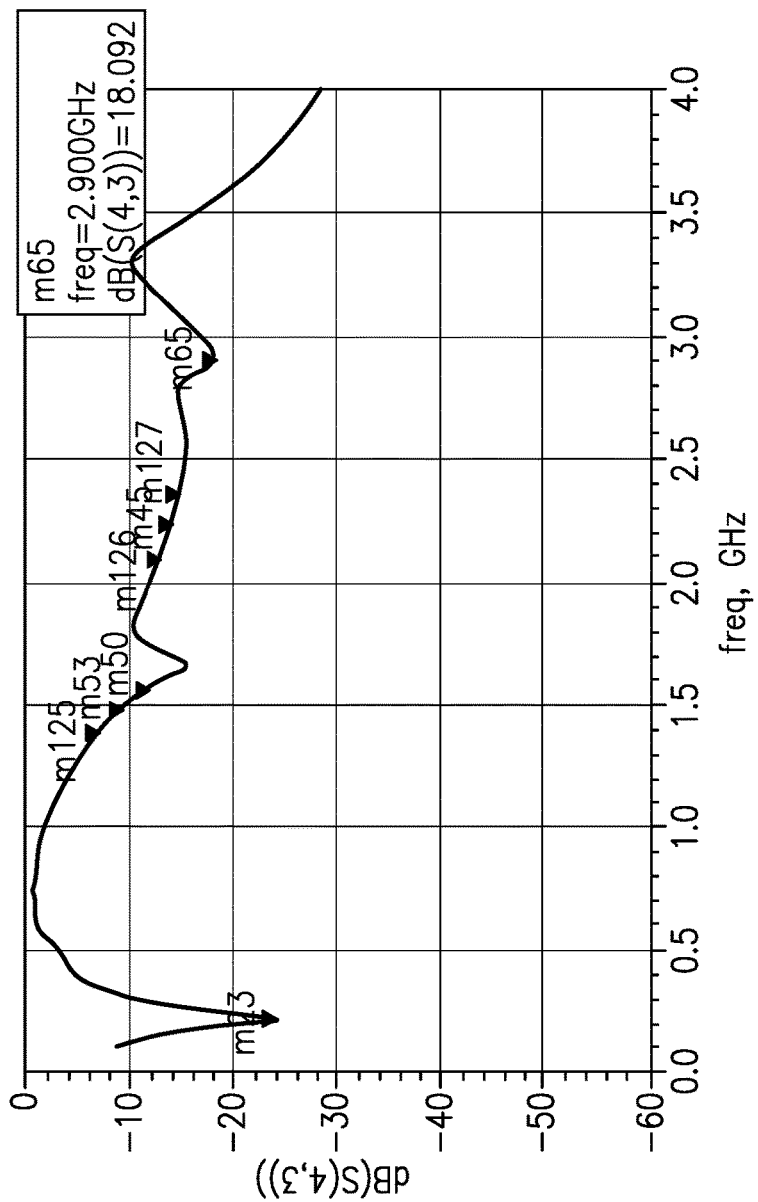
FIG. 4 is a graph of a frequency response for a matching network that includes an IPD die with bumps directly connected to vias that provide a path to radio frequency (RF) ground.

FIG. 4 is a graph of a frequency response for a matching network that includes an IPD die with bumps directly connected to vias that provide an electrical path to RF ground. As shown in the frequency response of FIG. 4, without conductive ground traces in the laminate to resonate the shunt capacitors on the IPD die, harmonic rejection is not exhibited and out-of-band suppression is relatively poor.

Figure 5:
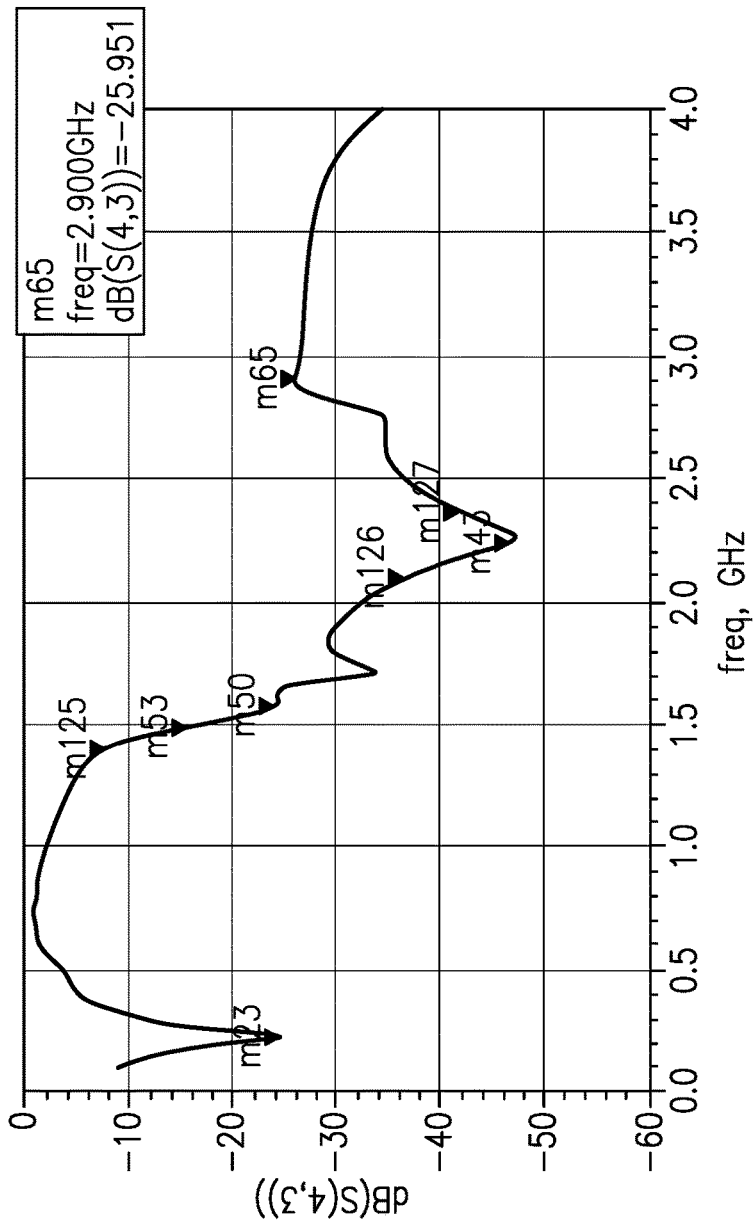
FIG. 5 is a graph of a frequency response for a matching network that includes an IPD die arranged in accordance with FIG. 3.

By adding ground traces in the laminate of an appropriate length to resonate the shunt capacitors on the IPD die (e.g., as shown in FIG. 3), desirable harmonic rejection can be implemented. FIG. 5 is a graph of a frequency response for a matching network that includes an IPD die arranged in accordance with FIG. 3. As shown in FIG. 5, a third harmonic rejection of greater than 35 dB has been demonstrated.

Referring back to FIG. 3, the IPD die 24' and conductive traces in the laminate substrate can implement an impedance transformer with an elliptic low pass filter response. As illustrated, the capacitors Cfilt1 and Cfilt2, the inductors Pri and Sec, and the conductive traces 27b and 27c can together implement such an elliptic low pass filter frequency response. The secondary inductor Sec of a transformer implemented with about 3½ turns can have a residual inductance of about 7 nH. This inductance can be applied as a series element in a 3-section elliptic filter. Such a series inductance in the transformer can improve out-of-band suppression and provide a frequency trap at a third harmonic (e.g., at about 2.7 GHz in certain implementations). The trap frequency can be set by a tank capacitance of an LC tank of the tuning network. At certain frequencies, such as around a third harmonic, the turn-to-turn capacitance can be sufficient.

Figure 6A:
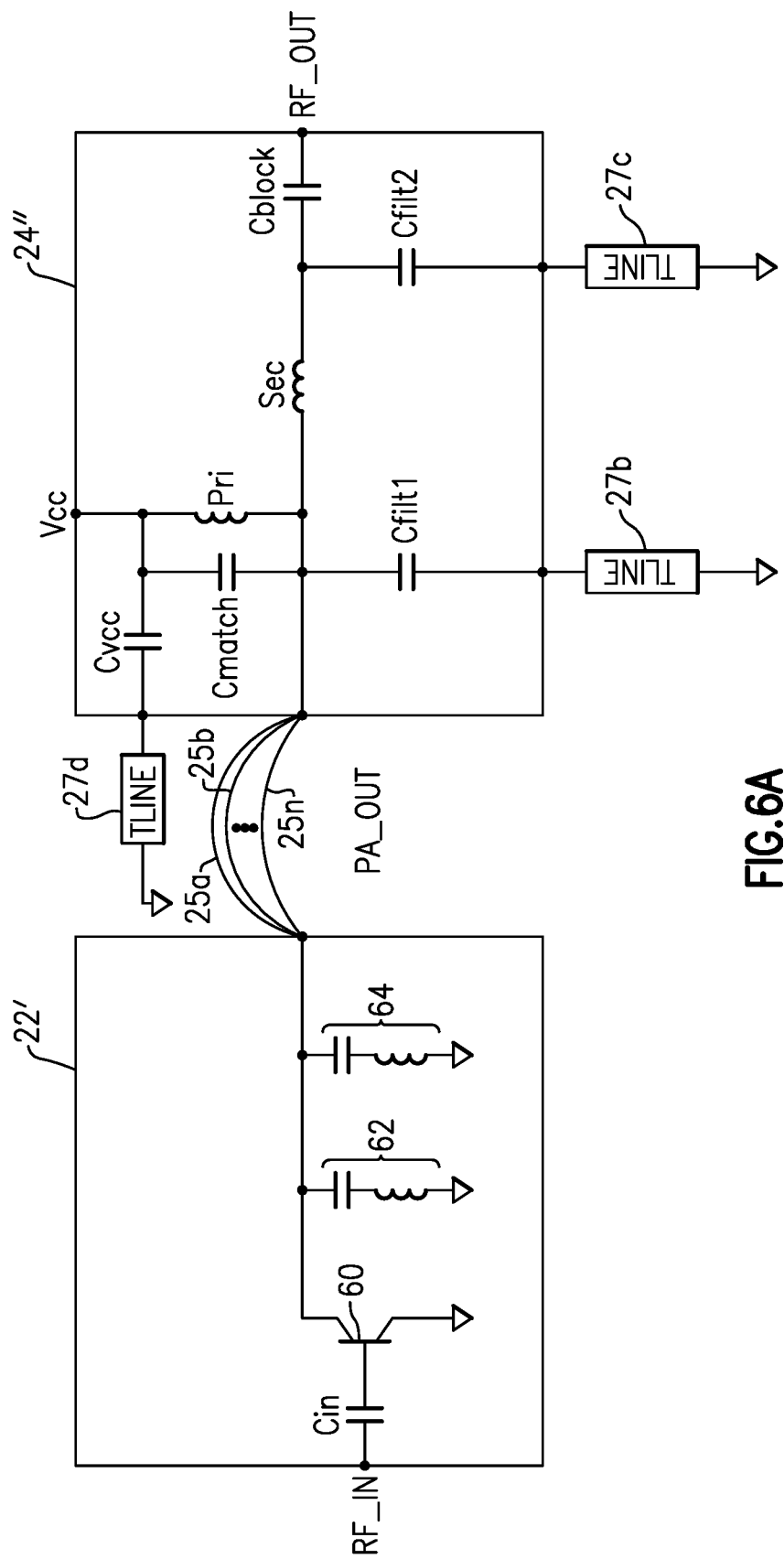
FIG. 6A is a schematic diagram of a power amplifier system that includes a matching network that includes an integrated passive device and a conductive trace in a packaging substrate, according to an embodiment.

FIG. 6A is a schematic diagram of a power amplifier system that includes a matching network that includes an integrated passive device and a conductive trace in a packaging substrate, according to an embodiment. The illustrated power amplifier system includes a power amplifier die 22', and IPD die 24'', wire bonds 25a to 25n, and conductive traces 27b, 27c, and 27d. The power amplifier die 22' of FIG. 6A is an example of a power amplifier die 22 of FIG. 2A. The IPD die 24'' of FIG. 6A is another example of an IPD die 24 of FIG. 2A.

The matching network illustrated in FIG. 6A can implement an L-C filter, such as a low pass elliptic filter. The elliptic filter response can be implemented using shunt IPD capacitors on IPD die 24'' and conductive traces 27b and 27c in the laminate substrate. Resonating the IPD shunt capacitors Cfilt1 and Cfilt2 with sufficiently long conductive traces 27b and 27c, respectively, can provide desirable performance for the elliptic filter response. To resonate the IPD shunt capacitors, the conductive traces can be too long to include on the IPD die 24''. Accordingly, the conductive traces 27b and 27c are implemented in the laminate substrate 26 on which the IPD die 24'' is disposed. The conductive traces 27b and 27c can each have a length of more than 100 microns. For instance, the conductive traces 27b and 27c can each have a length of about 300 microns in certain applications. A width of the conductive traces can be about 60 microns in certain applications.

As illustrated, the power amplifier die 22' includes an input capacitor Cin, a bipolar power amplifier transistor 60, a first frequency trap 62, and a second frequency trap 64. FIG. 6A illustrates that a power amplifier die can include one or more harmonic frequency traps. For instance, the first frequency trap 62 can be a second harmonic frequency trap and the second frequency trap 64 can be a fourth harmonic frequency trap. FIG. 6A also illustrates that a power amplifier can include a bipolar power amplifier transistor 60. The bipolar power amplifier transistor 60 can be a GaAs heterojunction bipolar transistor. A base of the bipolar power amplifier transistor 60 can receive the RF input signal RF_IN by way of an input capacitor Cin. The base can also receive a bias signal (not illustrated), such as a bias voltage. A collector of the bipolar power amplifier transistor 60 can provide a power amplifier output signal PA_OUT. As illustrated, wire bonds 25a to 25n provide the power amplifier output signal PA_OUT from the power amplifier die 22' to the IPD die 24". Any suitable number of wire bonds 25a to 25n can be implemented in parallel with each other. These wire bonds can provide an inductance in a signal path between the collector of the bipolar power amplifier 60 and the IPD die 24".

Figure 6B:
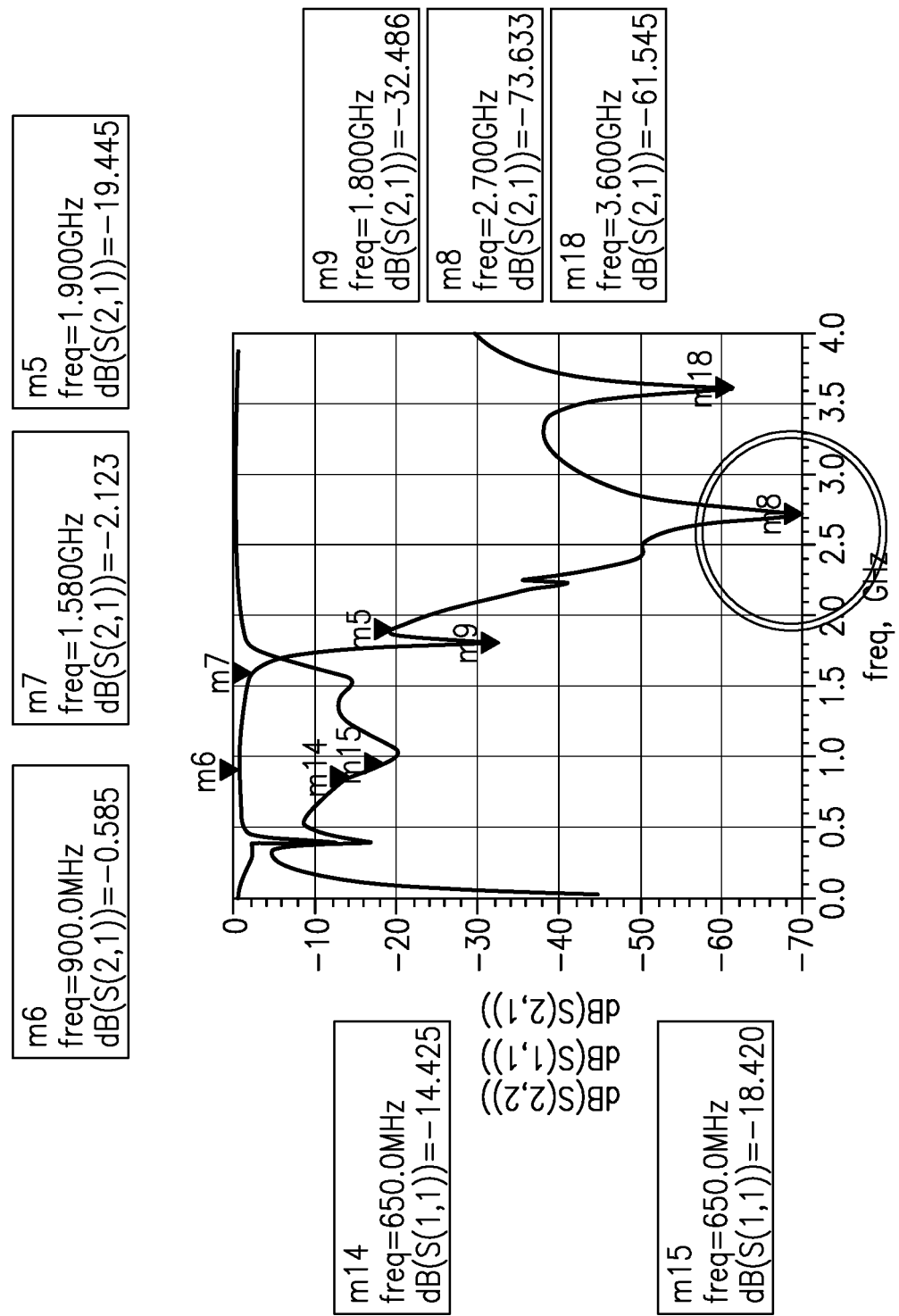
FIG. 6B is a plot that illustrates a frequency response of an elliptic filter of FIG. 6A.

FIG. 6B is a plot that illustrates a frequency response of an elliptic filter of FIG. 6A. As illustrated in FIG. 6B, simulation data indicate that the elliptic filter implemented by the matching network of FIG. 6A can provide frequency suppression at the third harmonic (about 2.7 GHz in this plot) and can be such that there is less than about −70 dB of power at the third harmonic, such as no more than about −74 dB of power at the third harmonic. The illustrated frequency response can provide desirable out of band suppression.

Figure 7:
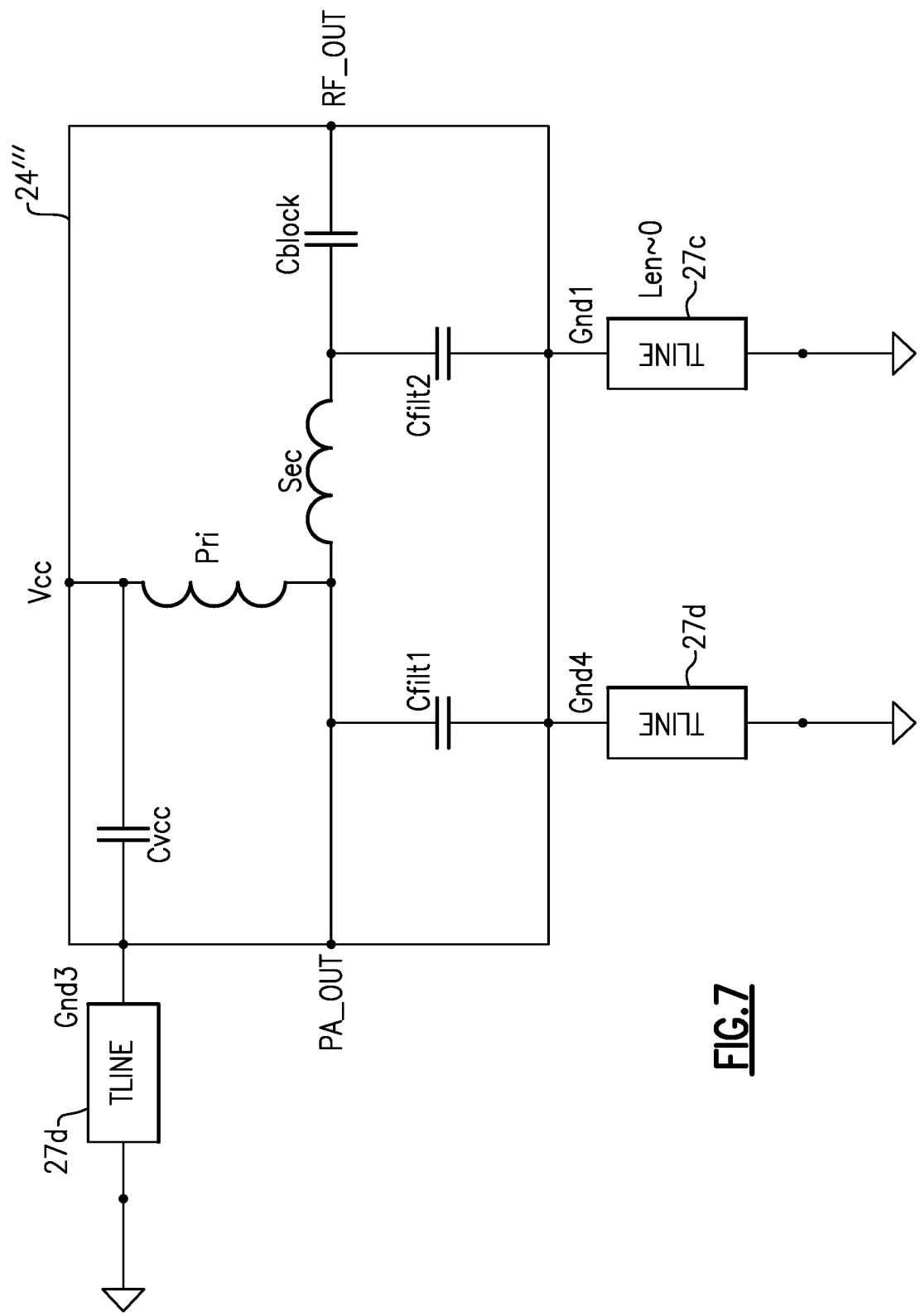
FIG. 7 is a schematic diagram of an IPD die and traces in a packaging substrate that are configured to provide impedance matching and phase rotation, according to an embodiment.

FIG. 7 is a schematic diagram of an IPD die and traces in laminate substrate that are configured to provide impedance matching and phase rotation, according to an embodiment. The IPD die 24' of FIG. 7 is another example of an IPD die 24 of FIG. 2A. In FIG. 7, the IPD die 24" includes IPD capacitors $C_{VCC}$, Cfilt1, Cfilt2, and Cblock and IPD inductors Pri and Sec. The IPD capacitors and/or IPD inductors can be formed on a silicon die or a die of any other suitable insulating material using a thin film process, for example. The IPD capacitors and IPD inductors of the IPD die 24' can be included in the matching network 14 of FIG. 1. As illustrated, the IPD die 24" can receive the power amplifier output signal PA_OUT and provide an RF output RF_OUT. Harmonic termination can be implemented on the power amplifier die in connection with the embodiment of FIG. 7.

A duplexer, such as a SAW duplexer or a BAW duplexer, can be included in an electrical path between the matching network and an antenna. The duplexer can receive the output RF_OUT of the matching network that includes the IPDs on the IPD die 24'. The transmit port impedance of the duplexer can be configured such that the magnitude of the resistive part at the band edges is at approximately a maximum. When this impedance is matched to a power amplifier output (e.g., power amplifier collector) that is electrically connected to the matching network, the efficiency can therefore be reduced at the band edges.

An impedance transformer IPD die, such as the IPD die 24''' of FIG. 7, and conductive traces in a laminate on which the IPD die is positioned can be used to provide the duplexer-to-collector match in an electronic system with a bipolar power amplifier transistor. The conductive traces 27b and 27c of FIG. 7 can provide inductances in an electrical path between IPD shunt capacitors Cfilt1 and Cfilt2, respectively, of the IPD die 24''' and RF ground. Using relatively long conductive traces in the supporting laminate substrate, the impedance of the transmit port of a duplexer can be rotated in the Smith chart. The length of a conductive trace can impact the inductance of the conductive trace. Accordingly, the lengths of conductive traces shown in FIG. 7 can be selected so as to implement a desired impedance rotation.

The conductive traces 27b, 27c, and 27d can each have a length of more than 100 microns. For instance, in certain applications, the conductive trace 27b can have a length of about 275 microns and the conductive trace 27c can each have a length of about 950 to implement the desired impedance rotation. As one example, the conductive trace 27d can have a length of about 2 mm. A width of each of the conductive traces 27b, 27c, and 27d can be about 60 microns in certain applications.

Figure 8:
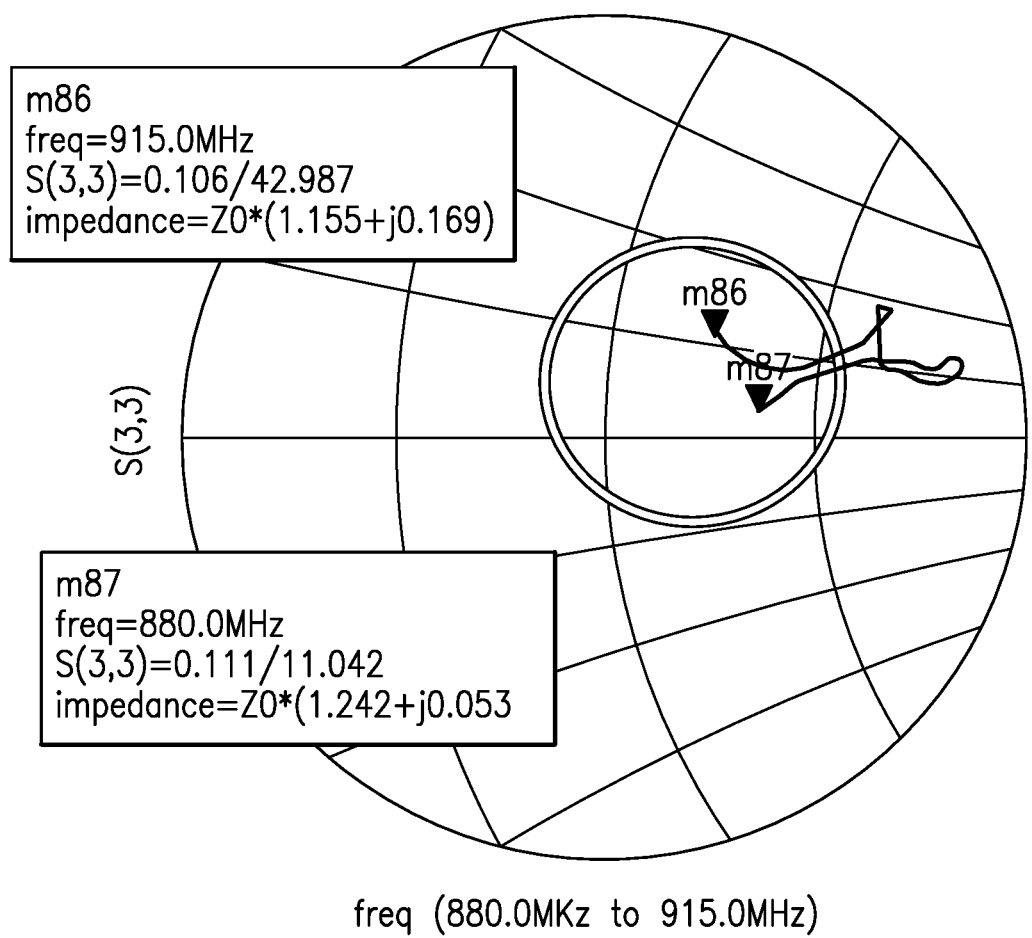
FIG. 8 is a Smith chart that illustrates impedance rotation implemented by the matching network of FIG. 7.

FIG. 8 is a Smith chart that shows impedance rotation implemented by the matching network of FIG. 7. A duplexer impedance can be matched and rotated by the matching network such that the magnitude of the resistive part at the band edges is at or near a minimum. FIG. 8 illustrates such an impedance rotation. When the rotated impedance is presented to a collector of a bipolar power amplifier transistor that provides the power amplifier output signal PA_OUT, the efficiency of the power amplifier system can therefore be improved at the band edges.

Figure 9:
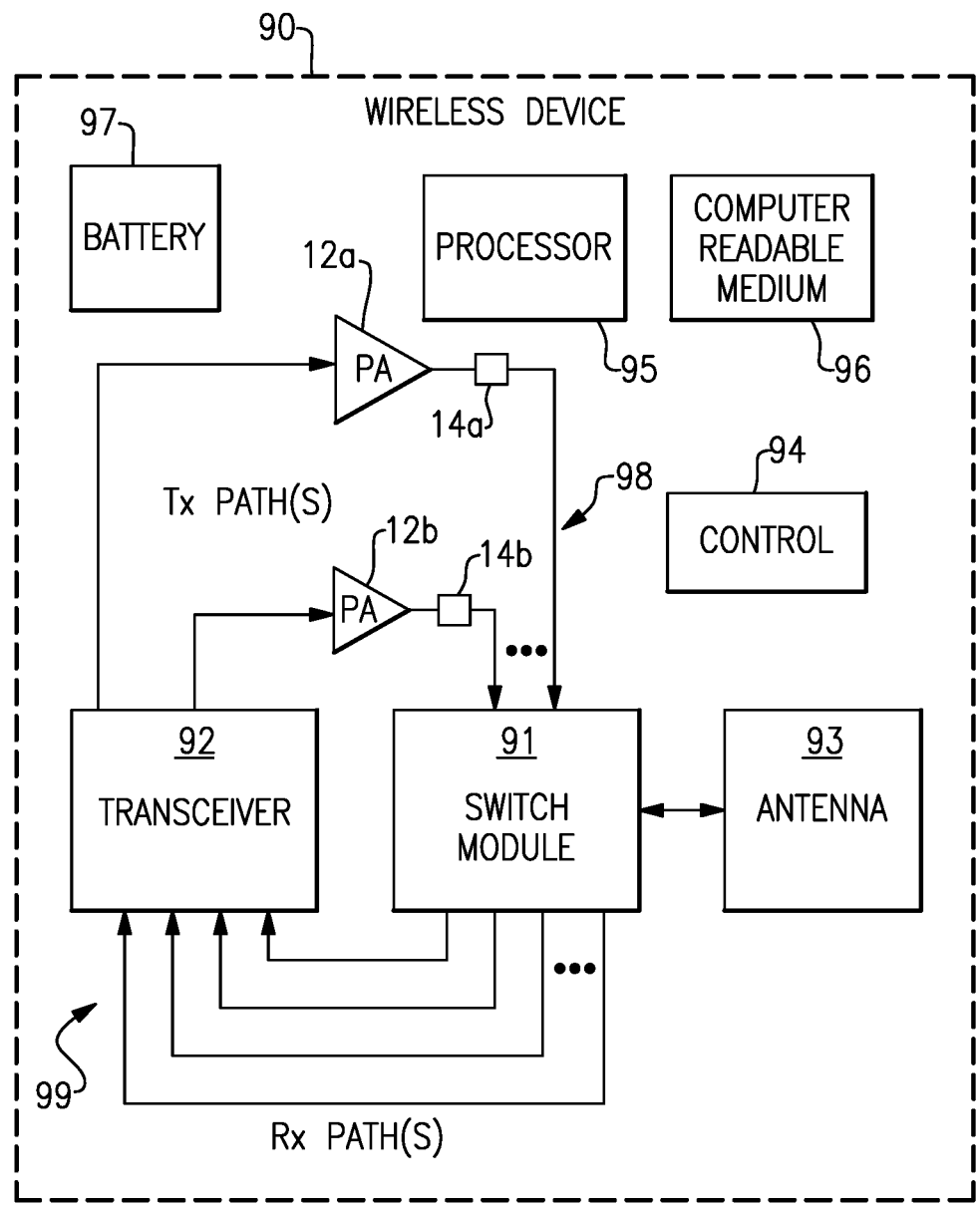
FIG. 9 is a schematic block diagram of an example mobile device that includes one or more matching networks in accordance with any of the embodiments of FIGS. 1, 2A-2B, 2D, 3, 6A, and/or 7.

FIG. 9 is a schematic block diagram of an example wireless or mobile device 90 that can include one or more power amplifiers and one or more matching networks. In one embodiment, the wireless device 90 can be a mobile phone, such as a smart phone. The wireless device 90 can have one or more matching networks 14a, 14b. For instance, the matching networks of the wireless device 90 can include any suitable combination of features of the matching networks in any of FIGS. 1, 2A-2B, 2D, 3, 6A, or 7. As another example, any of the power amplifiers discussed herein can be included in the wireless device 90 of FIG. 9.

The example wireless device 90 depicted in FIG. 9 can represent a multi-band and/or multi-mode device such as a multi-band/multi-mode mobile phone. By way of example, the wireless device 90 can communicate in accordance with Long Term Evolution (LTE). In this example, the wireless device can be configured to operate at one or more frequency bands defined by an LTE standard. The wireless device 90 can alternatively or additionally be configured to communicate in accordance with one or more other communication standards, including but not limited to one or more of a Wi-Fi standard, a 3G standard, a 4G standard or an Advanced LTE standard. Power amplifier systems of the present disclosure can be implemented within a mobile device implementing any combination of the foregoing example communication standards, for example.

As illustrated, the wireless device 90 can include a switch module 91, a transceiver 92, an antenna 93, power amplifiers 12a and 12b, a control component 94, a computer readable storage medium 95, a processor 96, and a battery 97.

The transceiver 92 can generate RF signals for transmission via the antenna 93. Furthermore, the transceiver 92 can receive incoming RF signals from the antenna 93. It will be understood that various functionalities associated with transmitting and receiving of RF signals can be achieved by one or more components that are collectively represented in FIG. 9 as the transceiver 92. For example, a single component can be configured to provide both transmitting and receiving functionalities. In another example, transmitting and receiving functionalities can be provided by separate components.

In FIG. 9, one or more output signals from the transceiver 92 are depicted as being provided to the antenna 93 via one or more transmission paths 98. In the example shown, different transmission paths 98 can represent output paths associated with different bands (e.g., a high band and a low band) and/or different power outputs. The transmission paths 98 can be associated with different transmission modes. One of the illustrated transmission paths 98 can be active while one or more of the other transmission paths 98 are non-active, for example. Other transmission paths 98 can be associated with different power modes (e.g., high power mode and low power mode) and/or paths associated with different transmit frequency bands. The transmit paths 98 can include one or more power amplifiers 12a and 12b to aid in boosting a RF signal having a relatively low power to a higher power suitable for transmission. The power amplifiers 12a and 12b can include the power amplifier 12 discussed above. Although FIG. 9 illustrates a configuration using two transmission paths 98, the wireless device 90 can be adapted to include more or fewer transmission paths 98.

In FIG. 9, one or more detected signals from the antenna 93 are depicted as being provided to the transceiver 92 via one or more receive paths 99. In the example shown, different receive paths 99 can represent paths associated with different signaling modes and/or different receive frequency bands. Although FIG. 9 illustrates a configuration using four receive paths 99, the wireless device 90 can be adapted to include more or fewer receive paths 99.

To facilitate switching between receive and/or transmit paths, the antenna switch module 91 can be included and can be used to selectively electrically connect the antenna 93 to a selected transmit or receive path. Thus, the antenna switch module 91 can provide a number of switching functionalities associated with an operation of the wireless device 90. The antenna switch module 91 can include a multi-throw switch configured to provide functionalities associated with, for example, switching between different bands, switching between different modes, switching between transmission and receiving modes, or any combination thereof.

FIG. 9 illustrates that in certain embodiments, the control component 94 can be provided for controlling various control functionalities associated with operations of the antenna switch module 91 and/or other operating component(s). For example, the control component 94 can aid in providing control signals to the antenna switch module 91 so as to select a particular transmit or receive path.

In certain embodiments, the processor 95 can be configured to facilitate implementation of various processes on the wireless device 90. The processor 95 can be, for example, a general purpose processor or special purpose processor. In certain implementations, the wireless device 90 can include a non-transitory computer-readable medium 96, such as a memory, which can store computer program instructions that may be provided to and executed by the processor 90.

The battery 97 can be any suitable battery for use in the wireless device 90, including, for example, a lithium-ion battery. The battery can provide a supply voltage to a multi-chip module, such as a multi-chip module that includes one or more power amplifiers 12a/12b and/or one or more matching networks 14a/14b.

Some of the embodiments described above have provided examples in connection with power amplifiers and/or mobile devices. However, the principles and advantages of the embodiments can be used for any other systems or apparatus that could benefit from any of the circuits described herein. The teachings herein are applicable to a variety of power amplifier systems including systems with multiple power amplifiers, including, for example, multi-band and/or multi-mode power amplifier systems. The power amplifier transistors discussed herein can be, for example, gallium arsenide (GaAs), CMOS, or silicon germanium (SiGe) transistors. The power amplifiers discussed herein can be implemented by field effect transistors and/or bipolar transistors, such as heterojunction bipolar transistors.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand-held computer, a laptop computer, a tablet computer, a personal digital assistant (PDA), a microwave, a refrigerator, a vehicular electronics system such as automotive electronics system, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could, " "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A module with integrated passive devices, the module comprising:
an integrated passive device die flip chip mounted on a packaging substrate, the integrated passive device die including a radio frequency output contact, a first capacitor, a second capacitor, an inductor coupled between the first capacitor and the second capacitor, and a third capacitor coupled between the inductor and the radio frequency output contact;
a first conductive trace of the packaging substrate electrically connected to the first capacitor by way of a bump, the first conductive trace being in an electrical path between the first capacitor and ground; and
a second conductive trace of the packaging substrate, the second conductive trace being in an electrical path between the second capacitor and ground.

2. The module of claim 1 wherein the integrated passive device die includes a fourth capacitor arranged in parallel with the second inductor.

3. The module of claim 1 further comprising a power amplifier die on the packaging substrate, the power amplifier die including a power amplifier configured to provide the radio frequency signal to a matching network that includes the first capacitor, the second capacitor, the inductor, the first conductive trace, and the second conductive trace.

4. The module of claim 1 wherein the first capacitor, the second capacitor, and the inductor are on a side of the integrated passive device die that faces the packaging substrate.

5. The module of claim 1 wherein a majority of the first conductive trace is within a footprint of the integrated passive device die.

6. The module of claim 1 wherein the first conductive trace is substantially spiral in plan view.

7. The module of claim 1 wherein the first conductive trace has a length that is longer than a longest dimension of the integrated passive device die.

8. The module of claim 1 wherein a length of the first conductive trace together with a capacitance of the first capacitor are together configured to suppress a harmonic frequency of a radio frequency signal received by the first capacitor.

9. A module with integrated passive devices, the module comprising:
an integrated passive device die on a packaging substrate, the integrated passive device die including a first capacitor, a second capacitor, a third capacitor, and a transformer that includes a first inductor and a second inductor, the first inductor being electrically coupled between the first capacitor and the second capacitor, the second inductor arranged to receive a supply voltage, and the third capacitor arranged in parallel with the second inductor;
a first conductive trace of the packaging substrate, the first conductive trace being in an electrical path between the first capacitor and ground; and
a second conductive trace of the packaging substrate, the second conductive trace being in an electrical path between the second capacitor and ground.

10. The module of claim 9 wherein the first inductor is a secondary coil of the transformer.

11. The module of claim 9 wherein the integrated passive device die includes a radio frequency output contact and a fourth capacitor coupled between the inductor and the radio frequency output contact.

12. The module of claim 9 wherein the first conductive trace of the packaging substrate is electrically connected to the first capacitor by way of a bump.

13. A power amplifier system with integrated passive devices, the power amplifier system comprising:
a power amplifier die on a packaging substrate, the power amplifier die including a power amplifier configured to provide a radio frequency signal;
an integrated passive device die flip chip mounted on the packaging substrate, the integrated passive device die including a radio frequency output contact, a first capacitor, and a second capacitor, a third capacitor coupled between the inductor and the radio frequency output contact, and a transformer, the transformer including an inductor coupled between the first capacitor and the second capacitor; and
first and second conductive traces of the packaging substrate, the first trace being electrically connected to the first capacitor by way of a first bump and being in an electrical path between the first capacitor and ground, and the second conductive trace being electrically connected to the second capacitor by way of a second bump and being in an electrical path between the second capacitor and ground.

14. The power amplifier system of claim 13 wherein the integrated passive device die includes a fourth capacitor that is in parallel with a second inductor of the transformer.

15. The power amplifier system of claim 13 wherein the second inductor is arranged to receive a supply voltage.

16. The power amplifier system of claim 13 wherein the first conductive trace is substantially spiral in plan view.

17. The power amplifier system of claim 13 wherein the first conductive trace has a length that is longer than a longest dimension of the integrated passive device die.

18. The power amplifier system of claim 13 wherein the first capacitor is configured to receive the radio frequency signal, and a length of the first conductive trace together with a capacitance of the first capacitor are configured to suppress a harmonic frequency of the radio frequency signal.

19. The power amplifier system of claim 13 wherein the integrated passive device die includes an input configured to receive the radio frequency signal, and the inductor is arranged in series between the input and the radio frequency output contact.

20. The power amplifier system of claim 13 wherein a majority of the first conductive trace is within a footprint of the integrated passive device die.

* * * * *